United States Patent [19]

Miyajima et al.

[11] Patent Number: 5,376,222
[45] Date of Patent: Dec. 27, 1994

[54] POLISHING METHOD FOR POLYCRYSTALLINE SILICON

[75] Inventors: Motoshu Miyajima; Yasuyuki Ichihashi, both of Kawasaki, Japan

[73] Assignee: Fujitsu Limited, Kanagawa, Japan

[21] Appl. No.: 937,320

[22] Filed: Aug. 31, 1992

[30] Foreign Application Priority Data

Sep. 4, 1991 [JP] Japan .................................. 3-224208
Sep. 6, 1991 [JP] Japan .................................. 3-226319

[51] Int. Cl.$^5$ ........................................... H01L 21/306
[52] U.S. Cl. ..................... 156/636; 437/228; 252/79.5; 106/3
[58] Field of Search ............... 106/3; 252/79.5; 156/636; 437/228; 57/308

[56] References Cited

U.S. PATENT DOCUMENTS

| | | | |
|---|---|---|---|
| 4,057,939 | 11/1977 | Basi | 51/308 |
| 4,786,325 | 11/1988 | Melard et al. | 106/3 |
| 4,942,697 | 7/1990 | Khaladji et al. | 51/283 R |
| 4,959,113 | 9/1990 | Roberts | 156/636 |
| 4,968,381 | 11/1990 | Prigge et al. | 156/651 |

FOREIGN PATENT DOCUMENTS 2-146732 6/1990 Japan .

OTHER PUBLICATIONS

"Planarization: Reading Between the Lines", Surface Tech Review, Rodel, vol. 1, issue 8, Mar. 1990, pp. 1-7.

*Primary Examiner*—Tom Thomas
*Assistant Examiner*—Trung Dang
*Attorney, Agent, or Firm*—Nikaido Marmelstein Murray & Oram

[57] ABSTRACT

This invention discloses a polishing method for flattening an inter-level insulating film or polycrystalline silicon inside a device isolation ditch in a semiconductor fabrication process.

To this end, the present invention grinds and flattens an insulating film having a step on the surface thereof by using a polishing solution containing an alkali solution and a grain, wherein a cation concentration in the alkali solution is higher than an OH$^-$ ion concentration in the alkali solution.

3 Claims, 11 Drawing Sheets

POLISHING METHOD FOR POLYCRYSTALLINE SILICON

BACKGROUND OF THE INVENTION

1. Field of the Invention

This invention relates to a polishing method. More particularly, it relates to a polishing method that is employed when polycrystalline silicon is ground in such a manner as to bury it into an isolation groove during a flattening step of an isolation insulating film in a fabrication process of a semiconductor device.

2. Description of the Related Art

Recently, a polishing method using a polishing solution has been employed to make flat an isolating insulation film isolating semiconductor devices, or to make flat an inter-level insulating film of a multilayered wiring.

A polishing solution used at the fabrication stage of conventional semiconductor devices is directed to polishing silicon single crystal and is not suitable for polishing an insulating film such as a silicon dioxide film. The conventional polishing solution uses an alkali solution prepared by dissolving an organic compound, and it cannot therefore provide a sufficient polishing rate for insulators. Accordingly, attempts have been made to improve the polishing rate by increasing the concentration of a grain such as colloidal silica or increasing the pressure at the time of polishing, but it has been difficult to significantly improve the polishing rate.

Figure 1:
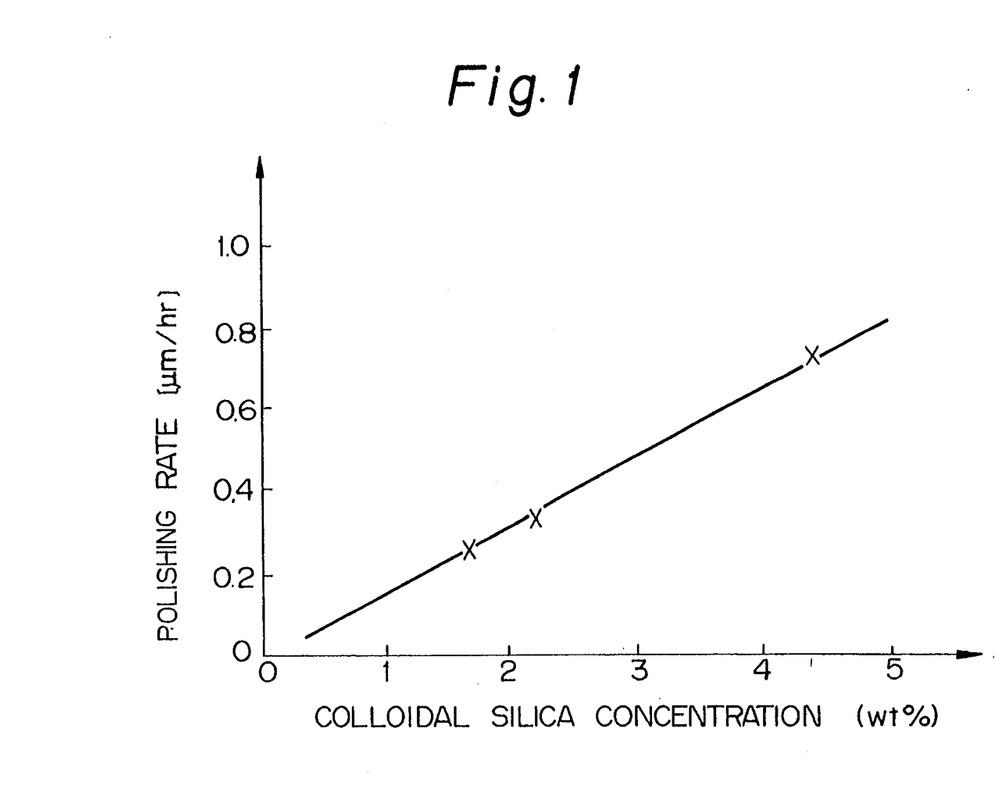
FIG. 1 is a graph showing the relation between a colloidal silica concentration in a conventional polishing solution and a polishing rate.

FIG. 1 of the accompanying drawings shows a polishing rate when a $SiO_2$ film is ground by using a commercially available polishing solution ("Nalco 2350", a product of Nalco Kabushiki Kaisha) prepared by mixing colloidal silica in an alkali solution dissolving therein an organic compound with a pressure of 400 $g/cm^2$ and with a polishing pad commercially available as "Rodel SUBA 500" (a product of Rodel Kabushiki Kaisha). When the concentration of colloidal silica is low, the polishing rate is about 0.2 $\mu m/hr$ and even when the concentration of colloidal silica is increased, the polishing rate is only about 0.7 $\mu m/hr$.

Moreover, when the concentration of the colloidal silica grain is increased, the feed of the grain cannot be made uniform to the entire surface of a wafer, so that the polishing quantity obtained is different depending upon the position, thereby rendering the polishing non-uniform.

When the polishing solution is adjusted to a high alkali range of a pH of at least 12 and is used for polishing, the polishing rate can be improved, but other problems develop. Namely, the colloidal silica as the grain is dissolved in such a high alkali region, the composition of the polishing solution changes and thus, the polishing rate fluctuates thereby resulting in nonuniform polishing.

As described above, the polishing solution for the silicon single crystal has a drawback in that its polishing rate is low. If the concentration of the grain is increased so as to improve the polishing rate, polishing becomes non-uniforms, and if polishing is carried out by adjusting the polishing solution to a high alkali range, the grain is dissolved to change the composition of the polishing solution, and uniform polishing cannot be accomplished.

In an isolation structure for isolating an element by an isolation groove in a semiconductor device, on the other hand, an isolating insulation film is formed on the inner wall of the isolation groove, and polycrystalline silicon is buried into the isolation groove. A polishing technique that so effects the polishing as to leave polycrystalline silicon in the isolation groove, for burying the polycrystalline silicon in the isolation groove, has drawn increasing attention.

The polishing solution filed in the patent application by the same Applicant as the present invention is known as a polishing solution for polishing such a polycrystalline silicon (KOKAI (Japanese Unexamined Patent Publication) No. 2-146732). This polishing solution is prepared by adding colloidal silica to an aqueous solution of ethylenediamine or hydrazine.

The polishing method using this polishing solution will be explained with reference to FIG. 2.

Figure 2A:
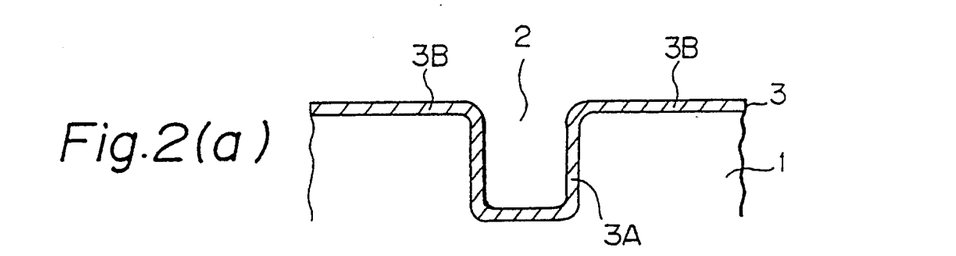
FIGS. 2(a)-2(d) are sectional views showing stepwise a conventional polishing method using a polishing solution.
Figure 2B:
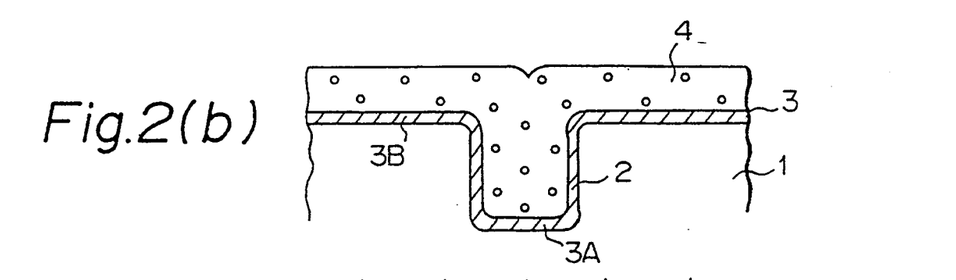
Figure 2C:
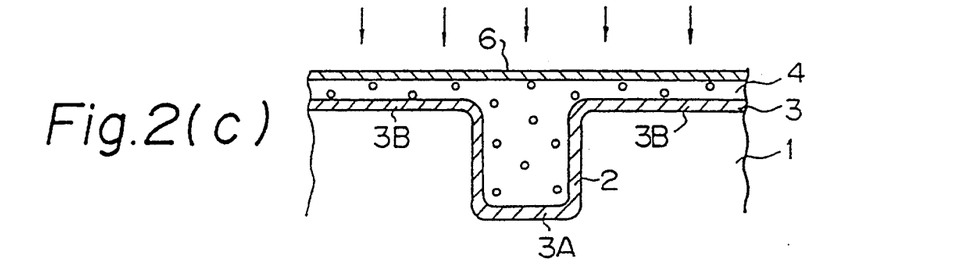

An isolation groove 2 is formed in a silicon substrate 1 by ordinary photolithography and subsequently, a 0.1 to 0.2 $\mu m$-thick $SiO_2$ film 3 is formed on the silicon substrate 1 inclusive of the inner surface of the isolation groove 2 by thermal oxidation (FIG. 2(a)). This $SiO_2$ film 3 serves as a isolating insulation film 3A inside the isolation ditch 2 and as a polishing stopper film 3B on the upper surface of the silicon substrate 1.

Next, a 1.5 $\mu m$-thick non-doped polycrystalline silicon layer 4 that sufficiently fills the inside of the isolation groove 2 and the upper surface of which is flattened is formed on the silicon substrate 1 by CVD (chemical vapor deposition; FIG. 1(b)).

The upper surface of the polycrystalline silicon layer 4 is polished chemically and mechanically using a surface grinder having an abrasive cloth bonded thereto while the polishing solution described above is added drop-wise. A silicon hydrate film 6 having a thickness of dozens of nm is formed on the surface of the polycrystalline silicon layer 4 due to the action of ethylenediamine or hydrazine, and this silicon hydrate film 6 is peeled by abrasion by the colloidal silica. The exposed surface of the polycrystalline silicon layer 4 changes to the silicon hydrate film 6 by the action of ethylenediamine or hydrazine, and this silicon hydrate film 6 is peeled because of the friction of the colloidal silica. In this way, polishing proceeds (FIG. 2(c)).

Figure 2D:
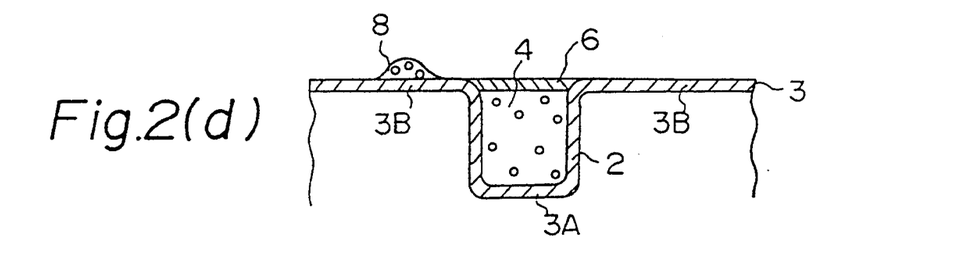

As polishing proceeds and the $SiO_2$ film 3 functioning as the polishing stopper film 3B is exposed, polishing does not proceed around the isolation groove 2, so that over-polishing is effected and an isolation structure having the polycrystalline silicon layer 4 buried into the separation ditch 2 is formed (FIG. 2(d)).

However, when the polycrystalline silicon layer 4 is polished by using the conventional polishing solution, the polishing residues of the polycrystalline silicon layer 4 or so-called "poly-protuberances" 8 are left in some cases on the surface of the polishing stopper film 3B of the silicon substrate 1. If the polyprotuberances are left in the active region, they result in a window opening defect in a subsequent step and eventually, in the formation of a defective chip, which results in abnormal semiconductor devices, and a drop in production yield.

SUMMARY OF THE INVENTION

It is a first object of the present invention to provide a polishing method that uses a novel polishing solution, and that can uniformly grind an insulating film in a semiconductor device stably and at a high polishing rate.

To accomplish this object, the present invention (hereinafter referred to as the "first invention") is characterized in that an insulating film having a step on the surface thereof is ground by using a polishing solution that contains an alkali solution and a grain, and in which the cation concentration of the alkali solution is higher than the concentration of OH⁻ ion in the alkali solution, and the insulating film is made flat.

It is a second object of the present invention to provide a polishing method that uses a novel polishing solution, and does not form poly-protuberances as polishing residues even when polycrystalline silicon is ground.

To accomplish this object, the present invention (hereinafter referred to as the "second invention") provides a polishing method of silicon comprising the steps of:

a) forming a groove on a substrate;
b) depositing silicon on the substrate inclusive of the groove; and
c) polishing silicon at portions other than the inside of the groove by using a polishing solution that contains an alkali solution having dissolved therein an organic compound or compounds and a grain, to which a cation of an alkali solution having dissolved therein an inorganic compound or compounds is added, and a pH of which is below 12.5.

BRIEF DESCRIPTION OF THE DRAWINGS

These objects as well as the advantages of the present invention will become more apparent from the following description of a preferred embodiment when considered in conjunction with the accompanying drawings, in which.

DESCRIPTION OF THE PREFERRED EMBODIMENTS

The polishing solution according to the first invention is characterized ill that the cation concentration in the alkali solution is higher than the OH⁻ concentration in the alkali solution.

The cation in the alkali solution of this polishing solution preferably is a cation of an alkali metal, a cation of an alkaline earth metal or an ammonium ion.

The cation of the alkali metal preferably is a sodium ion or a potassium ion.

The polishing solution of the present invention preferably contains a colloidal silica or silica grain.

Furthermore, a pH of the alkali solution of the polishing solution of the present invention is preferably within the range of 9.5 to 10.5.

According to the first invention, the cation concentration in the alkali solution is set to be higher than the concentration of the OH⁻ ion, the atomic bond of the insulating film can be cut efficiently by utilizing effectively the action of the cation, and polishing can thus be carried out. Accordingly, the insulating film can be uniformly ground stably at a high polishing rate without increasing the grain concentration.

Next, the second invention will be explained.

The inventor of the present invention has discovered that the addition of the cation of the alkali solution dissolving an inorganic compound is effective for preventing the occurrence of the poly-protuberances during polishing of the polycrystalline silicon layer.

Figure 3:
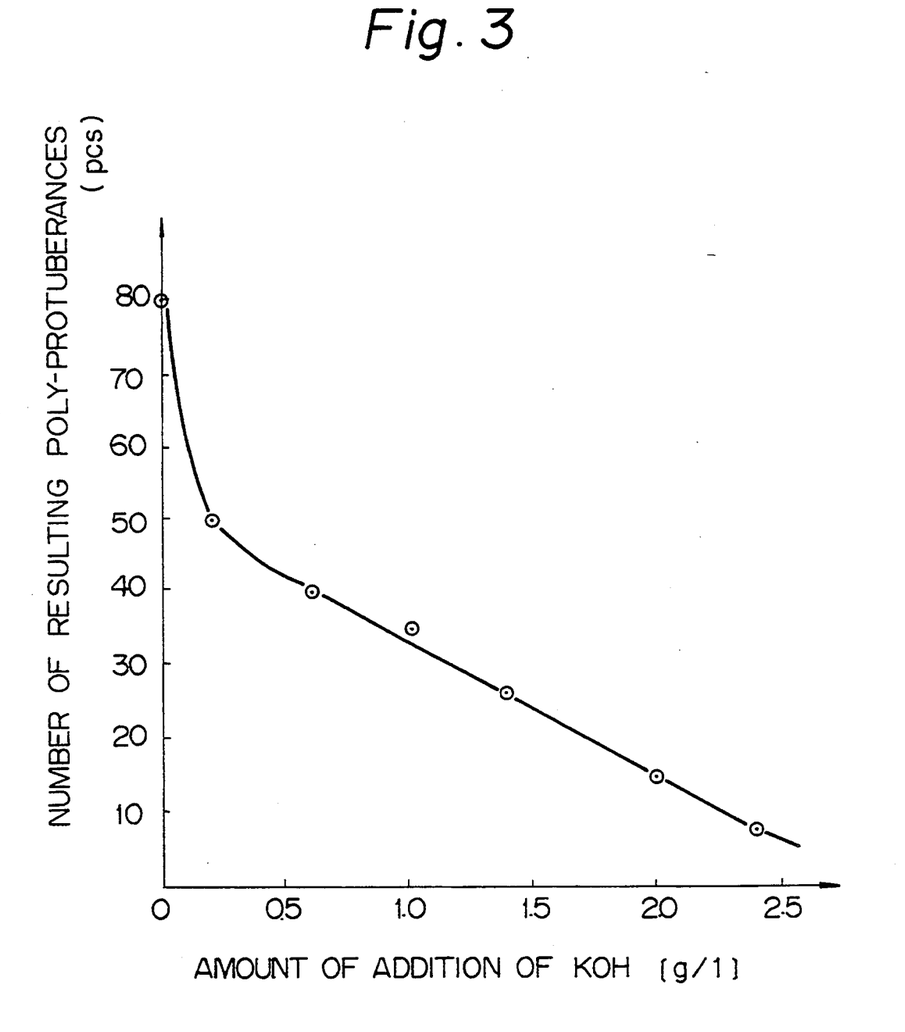
FIG. 3 is a graph showing the relation between the amount of KOH and the number of resulting poly-protuberances.

FIG. 3 is a graph showing the number of occurrence of the poly-protuberances when a K⁺ ion, for example, is added as the cation of the alkali solution dissolving the inorganic compound to the polishing solution. The number of the resulting poly-protuberances when the polycrystalline silicon layer on the 4-in. silicon substrate is ground using the polishing solution, which contains 2 wt. % of ethylenediamine and 0.2 wt. % of colloidal silica and to which KOH is added, is measured. FIG. 3 shows the change of the number of the resulting poly-protuberances when the amount of addition of KOH is changed. When KOH is not added, as many as 80 poly-protuberances occur, but when KOH is added, the number of the resulting poly-protuberances decreases drastically and when 0.6 g/l KOH is added, the number of the polyprotuberances drops to a half, i.e. 40, and drops to below 10 at 2.5 g/l KOH.

As described above, it is effective to add KOH to the polishing solution in order to reduce the number of the resulting poly-protuberances but when KOH is merely added, the pH of the polishing solution becomes as high as 12 or more. In such a high alkali region, silica or colloidal silica as the grain is dissolved and the composition of the polishing solution changes.

To prevent the fluctuation of the composition of the polishing solution, silica or colloidal silica as the grain and KOH may be supplied separately to the same stool, but the pH of the polishing solution during the practical polishing of the polycrystalline silicon rises unavoidably. Moreover, it has been found out that the pH of the polishing solution greatly affects the polishing rate at the time of polishing.

Figure 4:
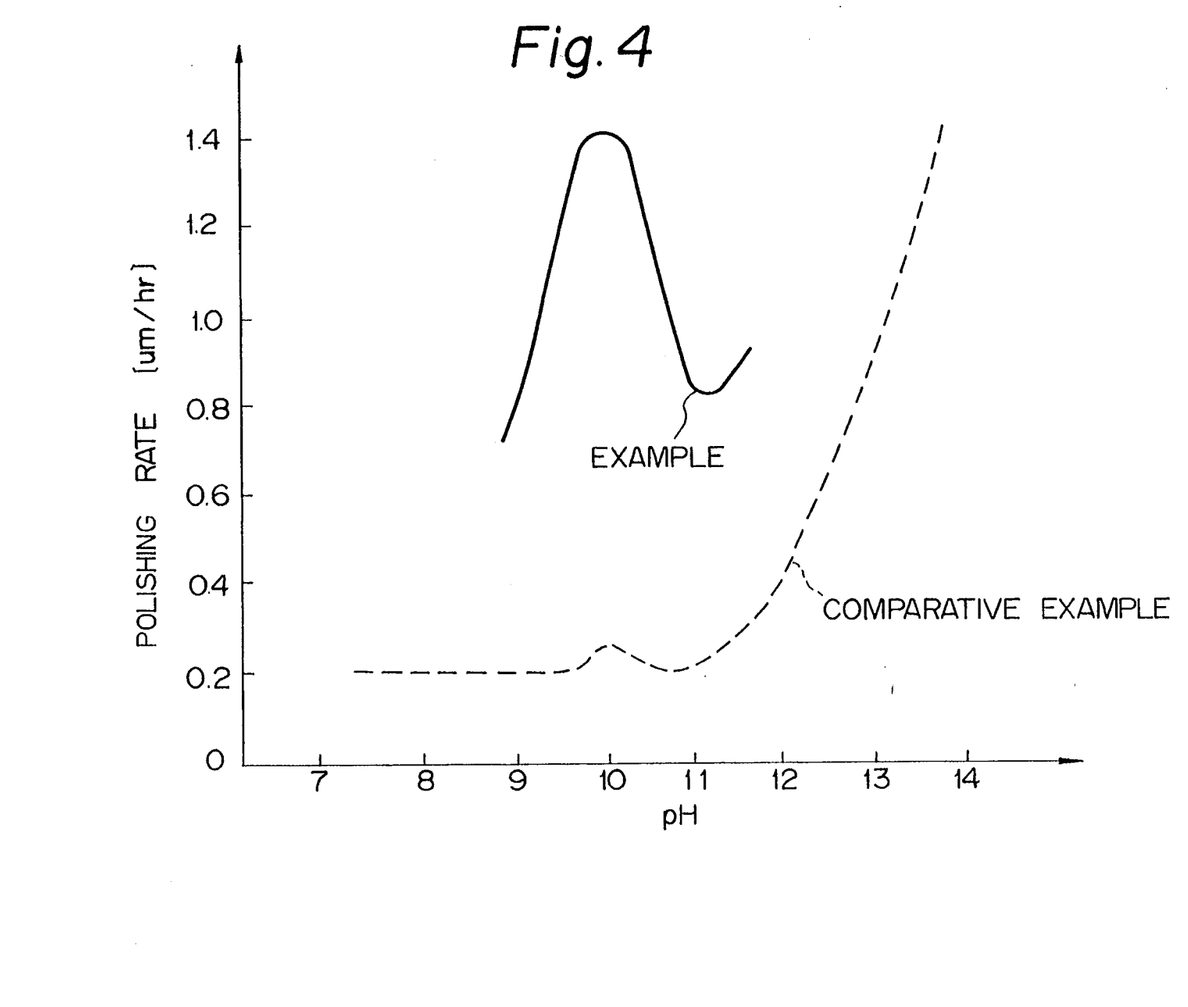
FIG. 4 is a graph showing the relation between a pH in a polishing solution according to an embodiment of the first invention and a polishing rate.

FIG. 4 shows the relation between the pH of the polishing solution and the polishing rate during polishing. The polishing rate of the polycrystalline silicon is high when the pH is within the range of 11 to 12.5, but drops to below half of the maximum polishing rate when the pH is smaller than 11 or is greater than 12.5.

In order to prevent the occurrence of the polyprotuberances and moreover, and to obtain a high polishing rate, the addition of an anion (OH⁻), which raises the pH of the polishing solution and invites the drop of the polishing rate, must be avoided, and only the cation (e.g. K+ ion) that prevents the occurrence of the poly-protuberances may be added to the polishing solution.

To obtain such a polishing solution, a neutral salt of an inorganic compound such as K or Na is added to the polishing solution containing the alkali solution dissolving therein the organic compound, and the grain, or after the inorganic compound such as KOH, NaOH, NH$_4$OH, etc., is added to the polishing solution, the pH of the polishing solution is adjusted by HCl, or the like.

Accordingly, the object described above can be accomplished by the polishing solution containing the alkali solution dissolving therein the organic compound and the grain, to which the cation of the alkali solution dissolving the inorganic compound is added, and the pH of which is below 12.5.

The grain contained in the polishing solution is preferably silica or colloidal silica, and the cation of the alkali solution dissolving the inorganic compound is preferably potassium ion, sodium ion or ammonium ion.

Furthermore, the organic compound contained in the polishing solution is preferably ethylenediamine or hydrazine.

If the composition of the polishing solution at the time of polishing has the composition described above, solutions each having the predetermined position may be supplied separately at the time of polishing.

According to the present invention, the cation of the alkali solution dissolving the inorganic compound is added to the polishing solution containing the alkali solution dissolving the organic compound and the grain, and the pH of the polishing solution is adjusted to below 12.5. Accordingly, even when the polycrystalline silicon is ground, poly-protuberances as a polishing residue do not occur and moreover, polishing can be carried out without a drop in the polishing rate.

Hereinafter, the present invention will be explained in further detail with reference to Examples thereof. However, the present invention is not limited in particular to such Examples.

EXAMPLE 1

The first example according to the first invention will be explained with reference to FIGS. 4 and 5.

This Example used a KOH solution as the alkali solution and KCl as the K+ ion source in the alkali solution. As the polishing condition, 0.5 wt. % of colloidal silica was mixed in the polishing solution, a machining pressure was 200 g/cm$^2$ and "Rodel SUBA 500" (a product of Rodel K.K.) was used as the abrasive cloth.

In the polishing condition of this Example described above, the colloidal silica concentration was 0.5 wt. % and was lower than that of the polishing condition shown in FIG. 1 and the machining pressure was set to half, i.e. 200 g/cm$^2$ of FIG. 1 so as not to raise the polishing rate.

In the polishing solution used in this Example, one gram-equivalent of KCl was added to the polishing solution, the pH of which was adjusted by KOH, so that the concentration of the K+ ion was higher than the concentration of the OH− ion. The polishing rate when the SiO$_2$ film was ground using the polishing solution of this Example was measured. The change of the polishing rate of the SiO$_2$ film when the pH was changed is represented by a solid line in FIG. 4.

As a Comparative Example, a polishing solution, the pH of which was adjusted by using only KOH. In the polishing solution of this Comparative Example, the concentration of the K+ ion was equal to that of the OH− ion. The polishing rate, when polishing was carried out using the polishing solution of this Comparative Example, was measured. The change of the polishing rate of the SiO$_2$ film when the pH was changed was represented by a dash line in FIG. 4.

In this embodiment, the polishing rate was at least 0.8 μm/hr irrespective of the pH value. Although the other polishing conditions were set in this embodiment so that the polishing rate became lower than in the prior art, a polishing rate that was far higher than that of the conventional polishing solution could be obtained. Particularly, when the pH value was within the range of 9.5 to 10.5, the maximum polishing rate of 1.4 μm/hr could be obtained.

The polishing solution in the embodiment shown in FIG. 4 was obtained by adding one gram-equivalent of KCl to the polishing solution, the pH of which was adjusted by KOH. FIG. 5 shows the change of the polishing rate of the SiO$_2$ film when the amount of addition of this KCl was changed. The polishing conditions were the same as the condition shown in FIG. 4. Namely, 0.5 wt. % of colloidal silica was added as the grain to the polishing solution, the machining pressure was 200 g/cm$^2$ and Rodel SUB 500 was used as the abrasive cloth.

Figure 5:
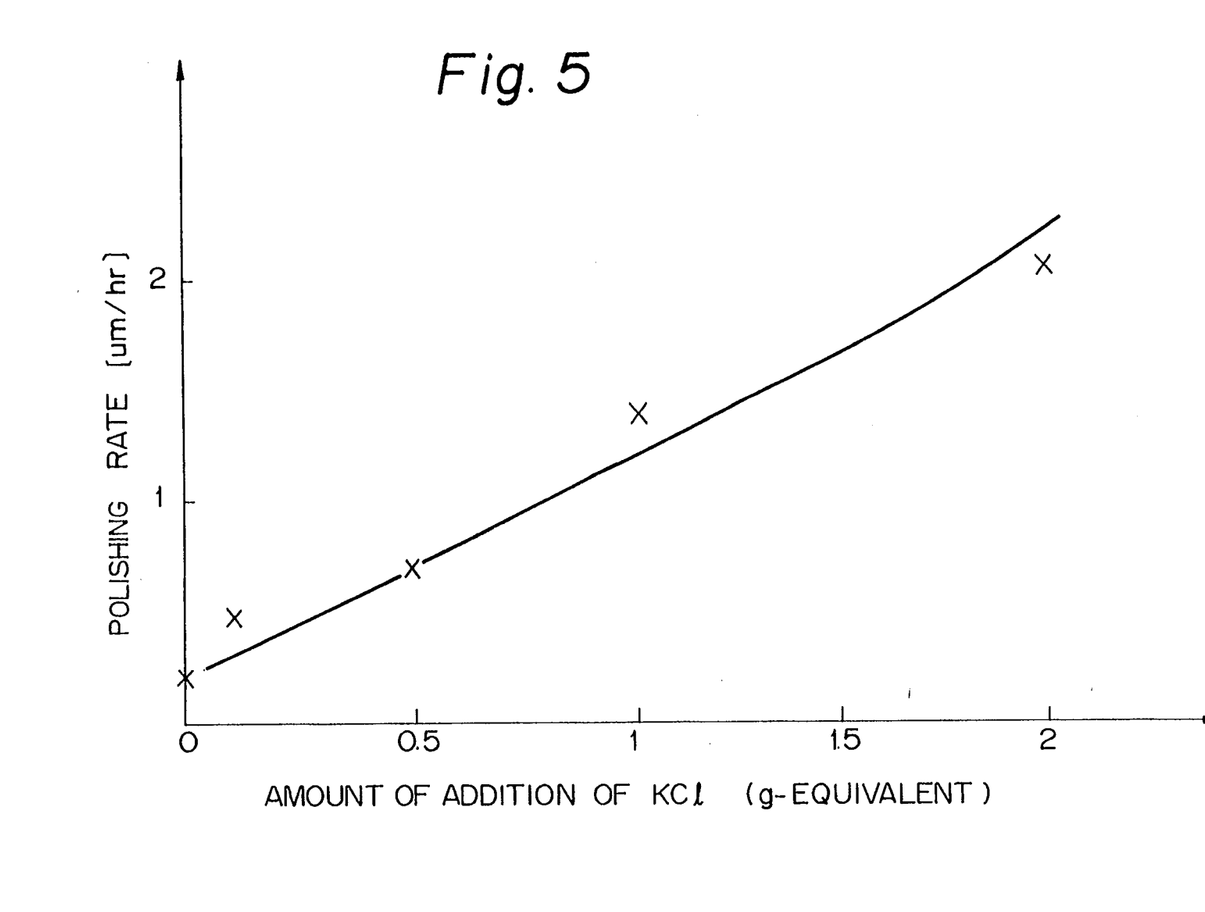
FIG. 5 is a graph showing the relation between the additional KCl amount in a polishing solution of the embodiment of the first invention and the polishing rate.

As can be clearly seen from the graph of FIG. 5, the polishing rate became linearly higher with an increase in the amount of addition of KCl. In other words, when the pH was constant (when the OH− ion concentration was constant), the polishing rate was improved with a higher concentration of the K+ ion.

Although the embodiment described above used an alkali solution containing the K+ ion as the alkali solution, the alkali solution containing the cation of other alkali metals such as the Na+ ion, the cation of the alkaline earth metals or the ammonium ion can also be used.

Although the embodiment described above used the colloidal silica as the grain, other grains such as silica can also be used.

Although the embodiment described above represents a polishing of the SiO$_2$ film, the present invention is also effective for polishing other insulating films such as a nitride film or nitrogen oxide films.

The concentration of the colloidal silica, the machining pressure and the abrasive cloth used in the embodiment given above merely illustrate an example of the polishing condition, and the present invention is effective under other polishing conditions.

EXAMPLE 2

The Example where the method of the second invention was applied to an inter-level insulating film of a wiring will be explained with reference to FIG. 6.

In the drawing, desired devices are already formed on a silicon substrate 11 and an insulating film 12, though they are not shown. A window 13 disposed so as to connect the devices fabricated. It is disposed at base, emitter, collector and resistance portions in the case of a bipolar transistor (FIG. 6(a)).

Next, a first wiring metal (Al-Cu 2%, etc.) was deposited to a thickness of 0.7 μm by sputtering, and was etched into a desired wiring pattern by an RIE process. Needless to say, ordinary wiring metals can be used as the first wiring metal besides the Al-Cu alloy described above. A PSG film 15 to serve as an inter-level insulating film was then deposited to a thickness of 2.5 μm by CVD on the entire surface of the substrate inclusive of the surface of the wiring metal 14 thus etched (FIG. 6(b)).

Figure 6A:
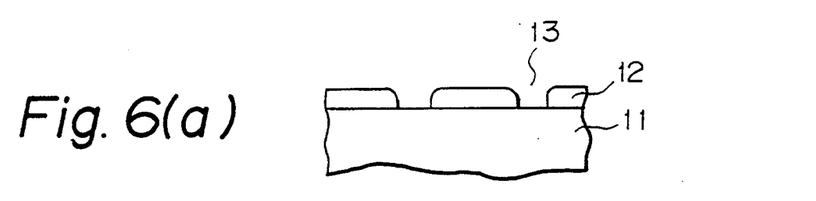
FIGS. 6(a)-6(e) are sectional views showing stepwise the first invention when it is applied to a flattening of layers.
Figure 6B:
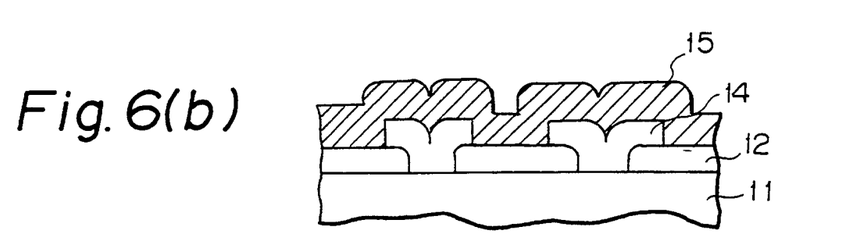
Figure 6C:
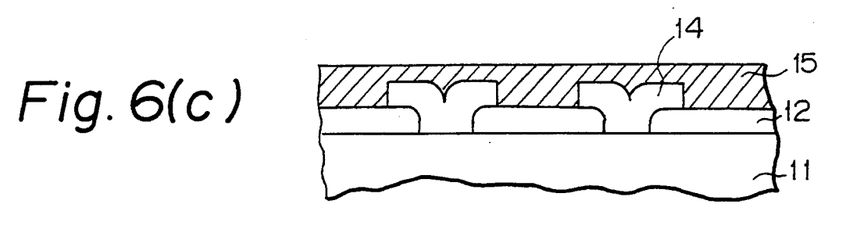
Figure 6D:
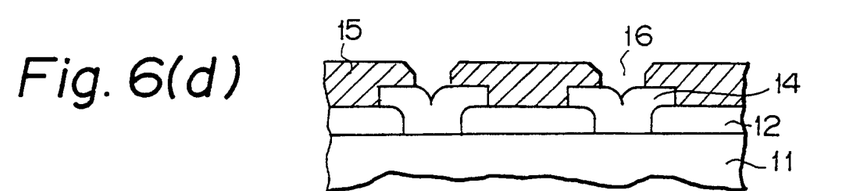

The PSG film 15 was ground and flattened by mechano-chemical polishing. The polishing solution was prepared by adding one gram-equivalent of KCl to an alkali solution that contained 0.5 wt. % of 0.01 μm colloidal silica and the pH of which was adjusted to 10.5 by 0.005 gram-equivalent of KOH and diluted hydrochloric acid. Rodel SUBA 500 a polishing pad commercially available as was used as the abrasive cloth and the machining pressure was 200 g/cm$^2$ The stool diameter of the grinder used was 400 cm and the number of revolutions was 150 rpm. FIG. 6(c) shows the state after completion of the polishing. The PSG thickness after flattening was within the range of 0.7 to 1.1 μm. Next, a contact hole 16 for connecting the first and second layer wirings was opened by the RIE process. In order to insure coverage inside the contact hole of the second layer wiring, isotropic RIE and anisotropic RIE were carried out at a ratio of 3:7 in the order named.

Figure 6E:
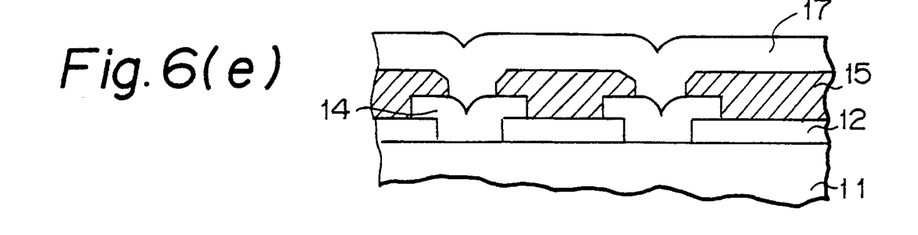
Figure 7:
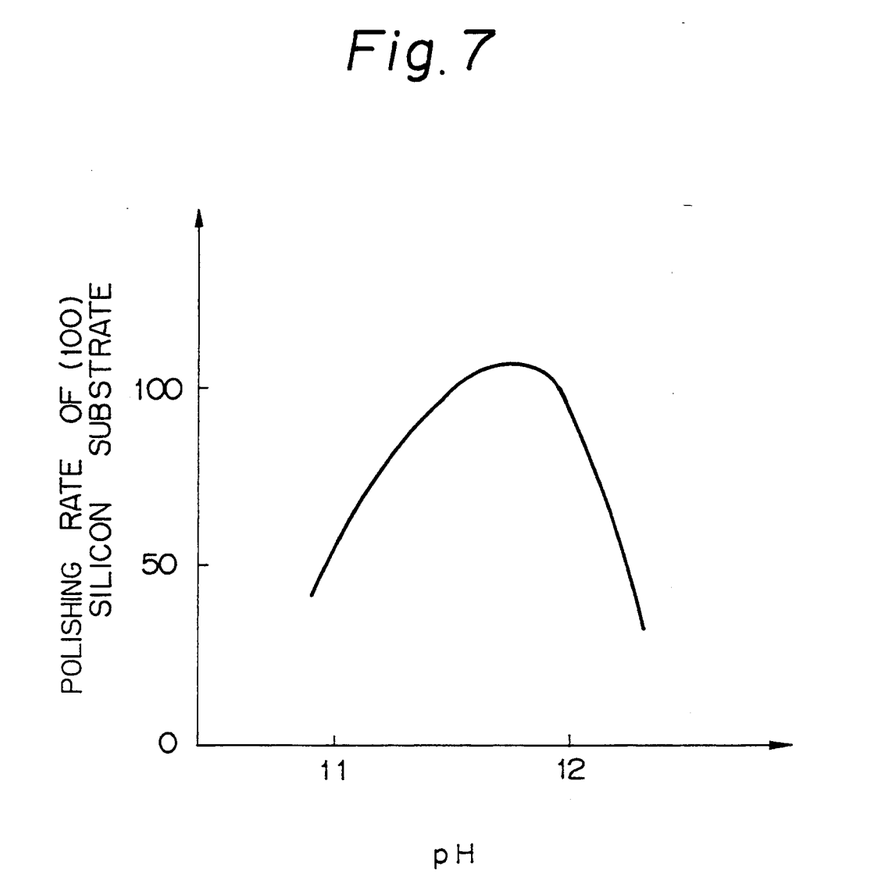
FIG. 7 is a graph showing the relation between a pH of the polishing solution and the polishing rate.

Next, the second layer wiring metal was deposited, and was etched into a desired pattern, and the second layer wiring layer 17 was formed (FIG. 6(e)). When this procedure was repeated, a flattened laminate wiring structure could be easily obtained.

Although this embodiment used the PSG film for the inter-level insulating film, an oxide film not containing an impurity or other films containing an impurity can of course be used.

As described above, the present invention can efficiently cut the atomic bond of the insulating film and can effect a polishing operation by effectively utilizing the action of the cation by using a polishing solution in which the cation concentration of the alkali solution is higher than the OH$^-$ concentration. Accordingly, the present invention can stably and uniformly grind the insulating film at a high rate without the necessity for increasing the grain concentration or the polishing pressure. Since the pH of the polishing solution need not be elevated, dissolution of the grain such as the colloidal silica can be prevented, and changes in the composition of the polishing solution can also be prevented.

Next, an embodiment of the second invention will be explained.

EXAMPLE 3

2.5 g/l of KOH was added to a mixture prepared by adding 0.2 wt. % of colloidal silica to an alkali solution dissolving therein 2.0 wt. % of ethylenediamine. The pH of the solution at this time was 13.4 to 13.5. A polishing solution was then prepared by adding HCl so that the pH was within the range of 11 to 12. A polycrystalline silicon layer on a 4-in. silicon substrate was ground using this polishing solution. A stool having a diameter of 400 mmφ was used, the number of revolutions of the stool was 150 rpm, the machining pressure was 400 g/cm$^2$ and a nap type emery cloth was used. The time necessary for polishing the polycrystalline silicon layer by 3 μm was 3 minutes.

COMPARATIVE EXAMPLE 1

Figure 8A:
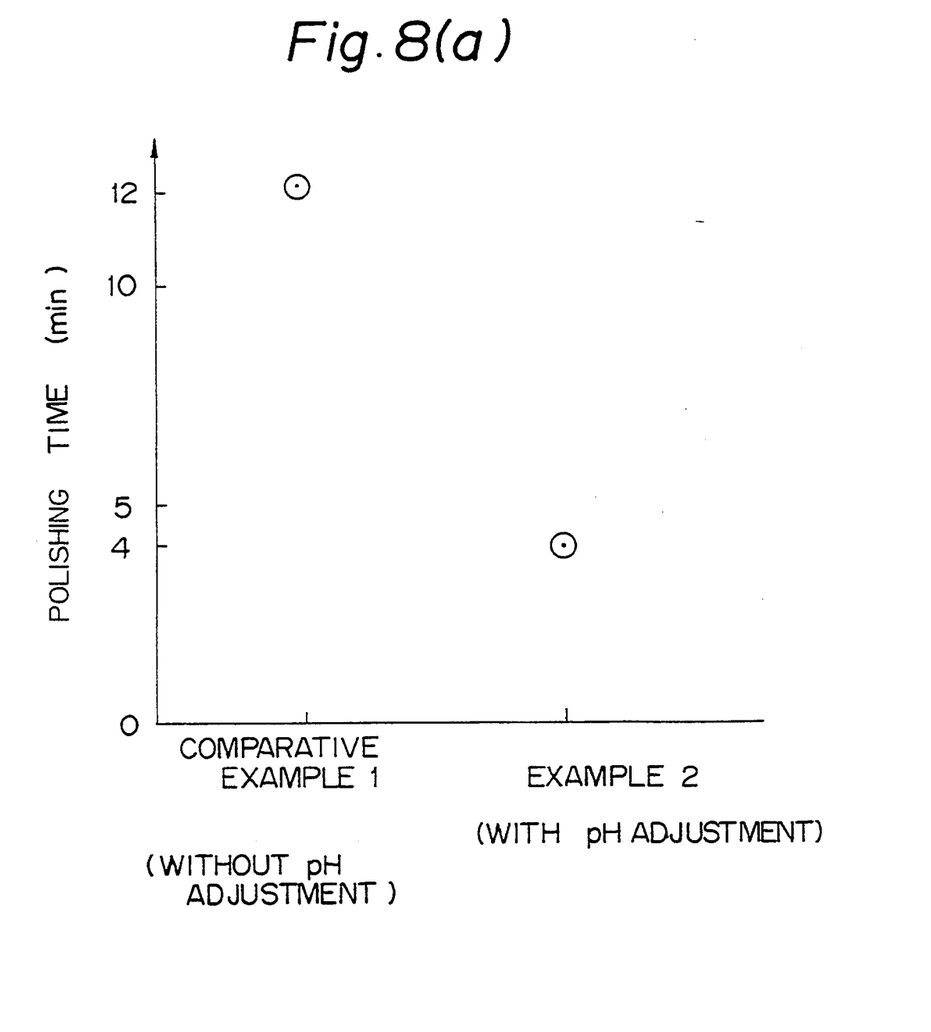
FIGS. 8(a)-(b) are graphs showing comparatively the polishing time by the polishing solution of the second invention with that of a Comparative Example.

2.5 g/l of KOH was added to a mixture prepared by adding 0.2 wt. % of colloidal silica to an alkali solution dissolving therein 2.0 wt. % of ethylenediamine so as to obtain a polishing solution without a pH adjustment by HCl. A polycrystalline silicon layer on a 4-in. silicon substrate was ground using this polishing solution. The polishing conditions were the same as those of Example 3. As shogun in FIG. 8(a), the polishing time of 12 minutes, three times that of Example 3, was necessary to polish the polycrystalline silicon layer 3 μm.

EXAMPLE 4

Figure 8B:
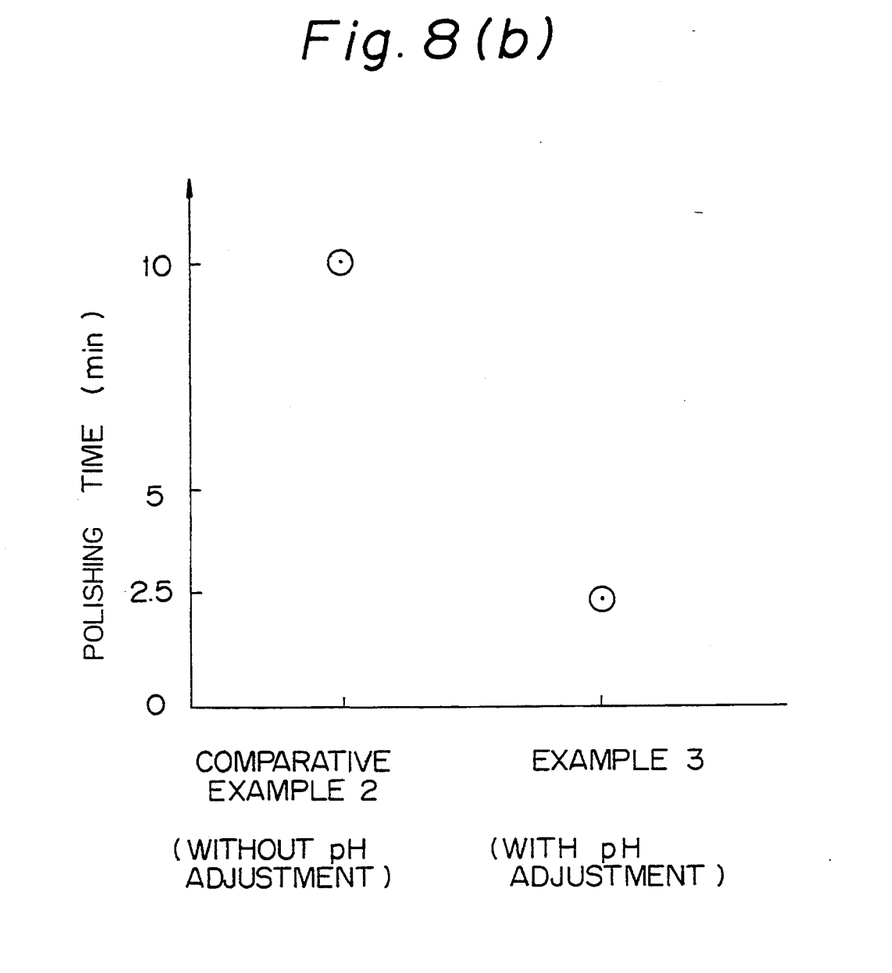
Figure 9A:
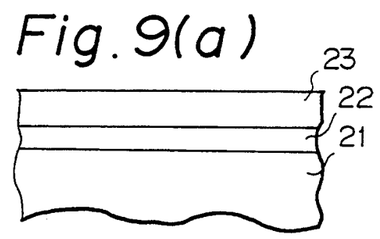
FIGS. 9(a)-9(s) is a sectional views showing stepwise the second invention when it is applied to a fabrication process of a semiconductor device.
Figure 9B:
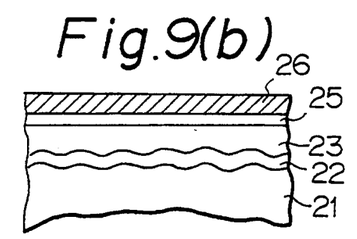
Figure 9C:
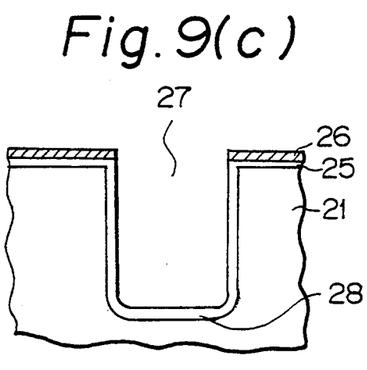
Figure 9E:
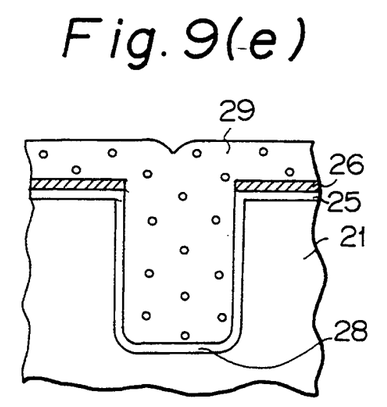
Figure 9F:
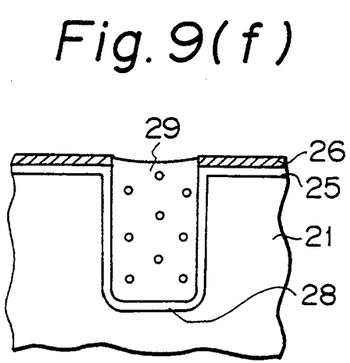
Figure 9G:
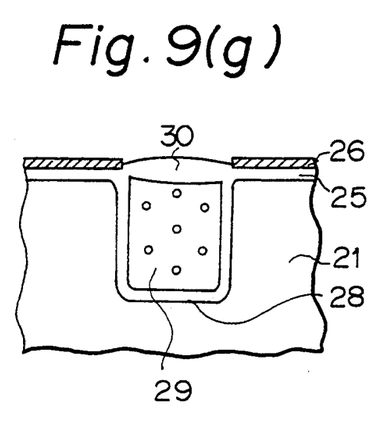

2.5 g/l of KOH was added to a mixture prepared by adding 0.4 wt. % of colloidal silica to an alkali solution dissolving therein 2.0 wt. % of ethylenediamine. A polishing solution was then prepared by adding HCl so that the pH was within the range of 11 to 12. A polycrystalline silicon layer on a 4-in. silicon substrate was ground using this polishing solution. A stool having a diameter of 400 mmφ was used, the number of revolutions of the stool was 150 rpm, the polishing pressure was 400 g/cm$^2$, and a nap type emergy cloth was used. As shown in FIG. 8(b), the time necessary for polishing the polycrystalline silicon layer 3 μm was 2.5 minutes.

COMPARATIVE EXAMPLE 2

2.5 g/l of KOH was added to a mixture prepared by adding 0.4 wt. % of colloidal silica to an alkali solution dissolving therein 2.0 wt. % of ethylenediamine so as to obtain a polishing solution without a pH adjustment by HCl. A polycrystalline silicon layer on a 4-in. silicon substrate was polished using this polishing solution. The polishing solution was the same as that of Example 1. As shown in FIG. 8(b), the polishing time of 10 minutes, four times that of Example 4, was necessary to polish the polycrystalline silicon layer 3 μm.

Example 5

An example illustrating the present invention applied to a semiconductor fabrication process will be explained with reference to FIG. 9.

A buried diffusion layer 22 was formed by an ion implantation process (I.I process) on a silicon substrate 21. A planar orientation and a specific resistivity of the silicon substrate 21 were selected in accordance with desired devices. The buried diffusion layer 22, too, was selected in accordance with desired device performance. For instance, a buried diffusion layer 22 of 35 Ω/square could be obtained by the ion implantation of antimony (Sb) at 70 keV and 3.5E 15 cm$^2$ into a silicon substrate 21 of P(100) and 10 to 20 Ωcm. Next, an epitaxial layer 23 was formed to a thickness of 1.5 μm (FIG. 9(a)).

Next, an oxide film 25 was deposited to the surface of the epitaxial layer 24 to a thickness of 1,000 Å by thermal oxidation and a nitride film 26 was likewise deposited to a thickness of 2,000 Å by CVD. The nitride film layer 26 was used as a polishing stopper film, and also as a mask during selective oxidation of an isolation groove 27 (FIG. 9(b)).

To electrically isolate a device from adjacent devices, the isolation groove 27 was formed in a desired region. The isolation groove 27 was formed by RIE as to completely cut the buried diffusion layer 22. For example, a depth of 4 to 5 μm. was sufficient under the conditions of the silicon substrate 21 and the buried diffusion layer 22 of this embodiment. An n-inversion region, not shown in the drawing, was then formed along the oxide film 28 when the inside of the groove 27 was subsequently oxidized, and an isolation defect occurred. Accordingly, boron (B) was implanted into the bottom of the separation ditch by I.I. at 40 keV and 2E13 cm$^{-2}$. Thereafter, a thermal oxide film 28 was formed to a thickness of 3,000 Å inside the separation ditch by selective oxidation (FIG. 9(c)).

Next, polycrystalline silicon was deposited by CVD so as to fill the inside of the separation ditch 27. The deposition thickness was sufficient to completely fill the ditch 27. If the width of the isolation groove 27 was 2 μm, for example, the thickness of 3 μm would be sufficient (FIG. 9(d)).

The polycrystalline silicon 28 inside the isolation groove 27 was then removed by polishing. This polishing was carried out by using the same polishing solution as that of Example 3 and in accordance with the same method as that of Example 3. The time necessary for polishing the polycrystalline silicon layer 3 μm was minutes (FIG. 9(e)). When the surface was inspected, only a few poly-protuberances were observed around the wafer. Furthermore, a thermal oxide film 30 was formed to a thickness of 4,000 Å on the surface of the polycrystalline silicon 29 filled into the separation ditch 2 (FIG. 9(f)).

Thereafter, the device was formed by removing the nitride film 26 by hot phosphoric acid.

Figure 10:
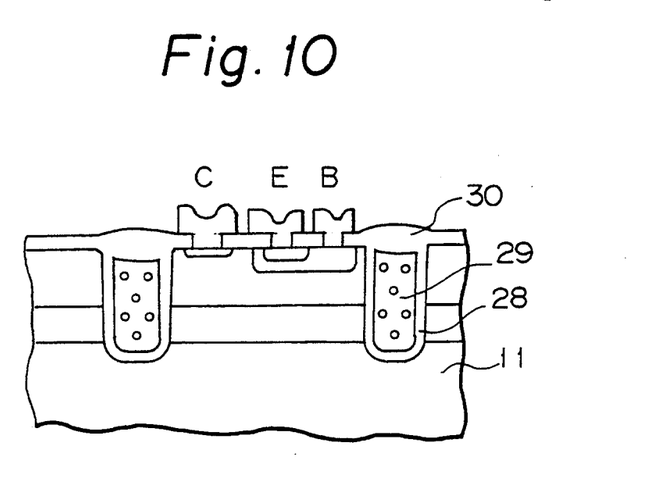
FIG. 10 is a schematic view of a semiconductor device that is completed by applying the second invention to a fabrication process of a semiconductor device.

FIG. 10 shows an example of the semiconductor device after completion.

As described above, the second invention carries out polishing by using the polishing solution prepared by adding the cation of the alkali solution dissolving the inorganic compound to the polishing solution containing the alkali solution dissolving the organic compound and the grain, so as to adjust the pH below 12.5. Therefore, the second invention can polish the polycrystalline silicon at a high polishing rate without generating poly-protuberances as polishing residues.

We claim:

1. A method of polishing silicon comprising the steps of:
    a) forming a groove on a substrate;
    b) depositing silicon on said substrate inclusive of said groove; and
    c) polishing silicon at portions other than the inside of said groove using a polishing solution comprising an alkali solution having an organic compound and a grain dissolved therein, and a cation of an alkali solution having dissolved therein a neutral inorganic salt of an alkali metal or an inorganic acid, a cation concentration of said polishing solution being higher than an $OH^-$ concentration of said polishing solution, a pH of said polishing solution being below 12.5.

2. A polishing method of polishing silicon according to claim 1, wherein said grain in said polishing solution comprises colloidal silica or silica, and said cation of said alkali solution comprises a potassium ion, a sodium ion or an ammonium ion.

3. A method of polishing silicon according to claim 6, wherein said organic compound in said polishing solution is ethylenediamine or hydrazine.

* * * * *